(12) United States Patent
Mensch et al.

(10) Patent No.: US 12,320,168 B2
(45) Date of Patent: Jun. 3, 2025

(54) ELECTRONIC SENSOR MODULE, HANDLE MODULE, AND MOVABLE VEHICLE ELEMENT

(71) Applicant: WITTE Automotive GmbH, Velbert (DE)

(72) Inventors: Reinaldo Mensch, Wuppertal (DE); Christian Zammert, Wuppertal (DE); Markus Herdering, Bochum (DE)

(73) Assignee: Witte Automotive GmbH, Velbert (DE)

( * ) Notice: Subject to any disclaimer, the term of this patent is extended or adjusted under 35 U.S.C. 154(b) by 322 days.

(21) Appl. No.: 17/645,469

(22) Filed: Dec. 22, 2021

(65) Prior Publication Data
US 2022/0195760 A1 Jun. 23, 2022

(30) Foreign Application Priority Data
Dec. 22, 2020 (DE) ...................... 10 2020 216 511.4

(51) Int. Cl.
*E05B 81/76* (2014.01)
*E05B 77/34* (2014.01)
(Continued)

(52) U.S. Cl.
CPC .............. *E05B 81/77* (2013.01); *E05B 77/34* (2013.01); *G01L 5/00* (2013.01); *E05B 83/40* (2013.01)

(58) Field of Classification Search
CPC .......... E05B 81/77; E05B 77/34; E05B 79/06; E05B 81/76; E05B 81/78; G01L 5/00;
(Continued)

(56) References Cited

U.S. PATENT DOCUMENTS 3,751,612 A * 8/1973 Hansen ................ H03K 17/945
  200/600
7,091,433 B2 * 8/2006 Meagher ................ H01H 13/06
  200/61.45 M
(Continued)

FOREIGN PATENT DOCUMENTS

CN   103510747 A   1/2014
CN   107435471 A   12/2017
(Continued)

OTHER PUBLICATIONS

Espacenet machine translation of WO 2018/162108 A1, generated Dec. 30, 2023. (Year: 2023).*
(Continued)

*Primary Examiner* — Kristina R Fulton
*Assistant Examiner* — Emily G. Brown
(74) *Attorney, Agent, or Firm* — Marshall & Melhorn, LLC (57) ABSTRACT

An electronic sensor module for a handle may have one sensor unit having a movable sensor element and a fixed sensor element which is arranged spaced apart from and opposite the movable sensor element. The module may also have an electronics unit which is electrically connected to the sensor elements for triggering a switching signal and on which the fixed sensor element is arranged. At least the movable sensor element may be encapsulated at least in some regions by a foam material and is designed as an integrated component in the form of a preassembly unit. Connection elements of the movable sensor element protrude from the foam material in a preassembly state and are connected to the electronics unit in an assembled state. A handle module and to a movable vehicle element are also described.

14 Claims, 9 Drawing Sheets

(51) Int. Cl.
*G01L 5/00* (2006.01)
*E05B 83/40* (2014.01)

(58) Field of Classification Search
CPC .......... G01L 1/142; B60R 25/01; G01D 5/24; H03K 17/975; H03K 2217/9651; H03K 2217/960755; H05K 1/185; H05K 3/306
See application file for complete search history.

(56) References Cited

U.S. PATENT DOCUMENTS

| | | | |
|---|---|---|---|
| 10,194,526 B1 * | 1/2019 | Simula | H05K 3/284 |
| 2011/0025522 A1 | 2/2011 | Peschl et al. | |
| 2014/0246873 A1 * | 9/2014 | Raulin | E05B 81/78 |
| | | | 292/336.3 |
| 2016/0160539 A1 * | 6/2016 | Saitou | E05B 85/16 |
| | | | 292/336.3 |
| 2019/0226248 A1 * | 7/2019 | Kalesse | H01Q 1/3241 |
| 2020/0047712 A1 * | 2/2020 | Spick | H04B 5/0081 |
| 2021/0231464 A1 * | 7/2021 | Vaysse | G01D 5/24 |
| 2021/0238897 A1 * | 8/2021 | Fontanet | H03K 17/97 |
| 2021/0246694 A1 * | 8/2021 | Spick | H03K 17/97 |
| 2021/0285830 A1 * | 9/2021 | Schmitz | G01B 7/24 |
| 2022/0276732 A1 * | 9/2022 | Hayashi | G06F 3/03547 |

FOREIGN PATENT DOCUMENTS

| | | | | |
|---|---|---|---|---|
| CN | 107835883 A | 3/2018 | | |
| CN | 107953848 A | 4/2018 | | |
| CN | 109312577 A | 2/2019 | | |
| CN | 110325697 A | 10/2019 | | |
| DE | 102012107189 A1 * | 1/2014 | | E05B 81/78 |
| DE | 102013114000 A1 | 6/2015 | | |
| DE | 102014107977 A1 * | 12/2015 | | E05B 15/1635 |
| DE | 102015103516 A1 * | 9/2016 | | |
| DE | 102015122086 A1 | 6/2017 | | |
| DE | 102017109328 A1 | 9/2018 | | |
| DE | 102019206282 A1 | 11/2020 | | |
| EP | 3322868 B1 | 3/2020 | | |
| WO | WO-2008049992 A1 * | 5/2008 | | B60R 13/02 |
| WO | 2018012329 A1 | 1/2018 | | |
| WO | WO-2018162108 A1 * | 9/2018 | | E05B 77/34 |
| WO | 2019234225 A1 | 12/2019 | | |

OTHER PUBLICATIONS

Merriam-Webster.com Dictionary, s.v. "encapsulate," accessed Oct. 4, 2024, https://www.merriam-webster.com/dictionary/encapsulate. (Year: 2024).*
Machine translation of DE 102014107977 A1. (Year: 2024).*
Espacenet machine trasnlation of WO 2018/162108 A1, generated Dec. 30, 2023. (Year: 2023).*
China National Intellectual Property Administration, Office Action in Application No. CN 202111569639.8, dated Jan. 11, 2023, 14 pages.
China National Intellectual Property Administration, Office Action in CN Application 202111569639.8, dated Jun. 3, 2023, 21 pages.

* cited by examiner

ELECTRONIC SENSOR MODULE, HANDLE MODULE, AND MOVABLE VEHICLE ELEMENT

FIELD

The invention relates to an electronic sensor module and to a handle module, in particular for a handle, such as an outside handle, for example for a movable vehicle element such as a sliding door, a tailgate, or an engine/front hood of a vehicle. The invention also relates to a movable vehicle element having such a handle module and such a sensor module.

BACKGROUND

Handle modules are known, for example, on vehicle doors, tailgates, or engine hoods. These are usually provided with a handle element which may be pivoted outwards in order to be able to open the vehicle door, the tailgate, or the engine hood. Handle modules can comprise electronic sensor modules for opening a lock on the door.

SUMMARY

The invention is based on the object of specifying a sensor module which is improved over the prior art, has a compact structure and allows for simplified assembly. Furthermore, a handle module having such an improved sensor module and a movable vehicle element having such a handle module are to be specified.

With regard to the electronic sensor module, the object is achieved according to the invention with the features specified in the claims. With regard to the handle module, the object is achieved according to the invention by the features specified in the claims.

With regard to the movable vehicle element, the object is achieved according to the invention by the features specified in the claims.

Further developments of the invention are the subject matter of the dependent claims.

The electronic sensor module according to the invention, in particular for a handle, such as a door handle, comprises at least one sensor unit having a movable sensor element and a fixed sensor element which is arranged spaced apart from and opposite the movable sensor element, and one electronics unit which is electrically connected to the sensor elements for triggering a switching signal and on which the fixed sensor element is arranged, wherein at least the movable sensor element is encapsulated at least in some regions by means of a foam material and is designed as an integrated component in the form of a preassembly unit, wherein connection elements of the movable sensor element protrude from the foam material in a preassembly state and are connected to the electronics unit in an assembled state.

In other words: At least the movable sensor element and optionally the fixed sensor element are encapsulated by means of the foam material and form the encapsulated and integrated component in the form of the preassembly unit which can be mounted on the electronics unit in a preassembly state.

In addition, the sensor module, in particular its electronic components, such as the sensor unit and an integrated circuit arrangement, can be surrounded at least in some regions by a potting material and be designed as an integrated structural unit, in particular as a separate assembly unit or a separate assembly module. The preassembly unit having the movable sensor element mounted on the electronics unit and the optional fixed sensor element is part of the integrated structural unit and thus part of the separate assembly unit of the sensor module.

The movable sensor element is encapsulated in some regions by means of the foam material in such a way that it is protected from external environmental influences such as moisture, rain, and dirty water. The movable sensor element and optionally the fixed sensor element are thus encapsulated and arranged in a protected manner in the preassembly unit by means of the foam material. In addition, such a resilient material is provided as the foam material that the movable sensor element is additionally resiliently mounted. The foam material can perform a connecting, resetting, and sealing function at the same time. For the connecting function, for example, the movable sensor element can be connected to the electronics unit by means of the foam material. In addition, the foam material for a resetting function can be designed in such a way and encapsulate the movable sensor element in such a way that it is automatically reset to a starting position or rest position after the end of a triggering movement.

The advantages achieved with the invention are in particular that the movable sensor element of the sensor unit is movably supported by means of the foam material in the sensor module, wherein the foam material assumes a connecting, resetting, and sealing function. In addition, at least the movable sensor element and optionally the fixed sensor element as an integrated structural unit and preassembly unit are protected from external environmental influences such as moisture, rain, and dirty water. Such a partial encapsulation of the sensor unit and development as a preassembly unit allows separate manufacture and delivery as well as simple assembly.

In the assembled state of the preassembly unit with the electronics unit, the electronic sensor module can also be designed as an assembly unit. As a result, the electronic sensor module can be variably mounted as a separate assembly unit on or in a handle module.

In a further development, the movable sensor element is designed as a resilient trigger element. This allows for a manually force-controlled pressure switch having a resetting function in a simple manner. In addition, the movable sensor element can be switched as an electronic sensor element, in particular a capacitive sensor electrode. As a result, the movable sensor element can also be used to detect an approach of an object and thus serve as an approach sensor.

One possible embodiment provides that the movable sensor element comprises a base element which is encapsulated completely or in some regions by the foam material. The base element forms a resilient trigger element which is provided with the foam material at least in the direction of the fixed sensor element. For example, the base element is designed as a trigger plate, in particular a leaf spring, a spring sheet, or a sheet metal plate. The connection elements of the movable sensor element are preferably designed as surface connection elements (=so-called SMD connection elements).

In addition, the sensor unit can be surrounded at least in some regions by a potting material. Hereby, the sensor unit itself is protected from external influences such as moisture, mechanical loads, dirt, water, and rain.

In one possible embodiment, the sensor unit is designed as a force sensor, in particular a force-controlled capacitive or inductive sensor, for performing a switching function, such as, for example, unlocking a door lock and opening a door.

For this purpose, an actuation element is also provided, which is arranged above and/or below the resilient trigger element. The actuation element can be encapsulated in some regions or completely by the foam material and be part of the integrated component and the preassembly unit. For example, in the case of an arrangement below the movable sensor element, the actuation element can be part of the integrated component. In the case of an arrangement above the movable sensor element, this can be arranged at a distance from the movable sensor element. In a further alternative, the actuation element arranged above the movable sensor element can be arranged directly on the movable sensor element and surrounded by the foam material and thus form part of the integrated component.

According to the invention, the handle module, in particular an outside handle module for a movable vehicle element, in particular a door of a vehicle, comprises at least the electronic sensor module described above and a handle support on or in which the electronic sensor module can be arranged, in particular can be mounted, or is arranged.

The advantages achieved with the invention are in particular that the electronic sensor module can be installed as a whole in the handle module, in particular preassembled as a separate integrated structural unit and assembly unit and then finally assembled in the handle module. The preassembly unit having at least the encapsulated movable sensor element and the optional encapsulated fixed sensor element and/or the optional encapsulated actuation element is part of the assembly unit. If the electronic sensor module is designed as an assembly unit, there is no need for complex individual assembly steps, as are known from the prior art. In addition, by designing the handle module having a sensor module located on the inside having encapsulated electronic components, these are arranged in a protected manner. In addition, the sensor module can be encapsulated using a potting compound and thus protected from external influences.

In one possible embodiment, the electronic sensor module is designed as a triggering unit for automatically triggering a function, in particular for triggering an unlocking and automatic opening of a door lock of the door. By integrating the electronics unit and the sensor unit into the electronic sensor module and thus into the triggering unit, the sensor module can, in addition to the triggering function, assume and execute other functions, for example other electronic handle, lock, and/or door functions.

If an actuation element is arranged above a movable sensor element in the sensor module, the handle support and the actuation element can additionally surround the triggering unit in an encapsulating manner.

By designing the sensor module as an integrated structural unit in the handle module and the additional encapsulation of the sensor module by the handle support and the actuation element, an additional sealing plane on the outer side of the handle module is provided, so that the actuation mechanism, in particular a lifting mechanism, of the actuation element is also sealed off.

One possible embodiment provides that the integrated component of the sensor module in the handle support is arranged and mounted on an inner side of the handle support in the region of a through opening and opposite the actuation element. This allows a compact design of the handle module and small actuation strokes.

In a further embodiment, the electronics unit comprises a printed circuit board having a first surface side and a second surface side. An integrated circuit arrangement, for example multi-function electronics for one or more functions, in particular for one or more electronic handle, lock, and/or door functions, is arranged on the first surface side. The sensor unit is arranged on the opposite, second surface side.

A further development provides that the sensor unit is designed as a force sensor, in particular a force-controlled capacitive or inductive sensor, for unlocking and opening the lock and the movable vehicle element. In particular, the sensor unit is designed as a so-called MOC module (=metal-over-cap module), in which the metallic sensor elements located on the inside are encapsulated from the outside.

For example, the sensor unit comprises a sensor housing, the movable sensor element, and the fixed sensor element. The fixed sensor element can for example be arranged directly on the second surface side of the printed circuit board. The movable sensor element, in particular a trigger element, can be arranged in a receiving opening of the sensor housing. In this case, the movable sensor element is arranged in particular at a distance from the fixed sensor element. The sensor housing and the movable sensor element encapsulate from the outside the fixed sensor element located on the inside. The sensor housing is in particular a plastics housing and can be molded, in particular injection molded, onto the printed circuit board. The sensor housing can be designed as a 2-component housing. For example, the sensor housing can have a soft housing wall located on the inside and an outer hard housing wall surrounding it. The sensor housing serves as a seal against moisture and contamination of the interior of the sensor unit.

When the electronic sensor module is in the built-in state in the handle module, the movable sensor element, in particular the trigger element, is arranged in the region of the through opening in such a way that it at least partially covers the through opening from the inside. In addition, the actuation element is arranged in the region of the through opening in such a way that it at least partially covers the through opening from the outside. In particular, the actuation element protrudes into the through opening at least in some regions in such a way that it is arranged spaced apart from the movable sensor element, for example the trigger element, in an unactuated position. This allows a compact design of the handle module and small actuation strokes. In addition, the actuation forces can be set; in particular, threshold values can be specified.

Another embodiment provides that the actuation element comprises a pressure transmission element which protrudes inwardly in the direction of the sensor unit. For example, the actuation element comprises an inwardly protruding pressure pin, for example a bolt or pin, which can be moved in the pressure direction to actuate the movable sensor element. In particular, the actuation element can be actuated in such a way that it can be moved in the pressure direction through the through opening to the movable sensor element, a trigger element for example, and moves this in the direction of the fixed sensor element upon further pressure actuation. This reduces the distance between the movable sensor element, for example a trigger element, and the fixed sensor element, so that a measuring field present between them changes. For this purpose, the movable sensor element is designed, for example, as a spring plate or a spring sheet.

Furthermore, the actuation element can have an inner side opposite an outer actuation surface, which inner side is sealingly connected to the handle support by means of a connecting element, at least in the region of the through opening. The connecting element can additionally be designed as a resetting element which, when the actuation element is actuated from an unactuated position to an actuated position, resets it to the unactuated position when the actuation element is not actuated. For example, the connecting element is designed as a plastics strand, in particular a rubber or foam strand. On the side of the actuation element facing the sensor unit, the connecting element can form a circumferential sealing strand arranged in the edge region of the through opening. Alternatively or additionally, the connecting element can surround the actuation element on the side facing the sensor unit and seal it against moisture and contamination. For this purpose, the connecting element is formed from a soft component material, in particular from a foam, plastics, or rubber material.

In addition, the invention relates to a movable vehicle element which comprises at least one handle module, as described above, in which an electronic sensor module, as described above, can be arranged or is arranged. The movable vehicle element can be an element which can be opened manually or electrically, in particular pivoted open or pushed open, such as a vehicle door, a sliding door, a front hood or engine hood, or a tailgate of a vehicle.

DESCRIPTION OF THE FIGURES

Embodiments of the invention are explained in greater detail with reference to the drawings, in which.

DETAILED DESCRIPTION

Parts corresponding to one another are provided with the same reference signs in all figures.

Figure 1:
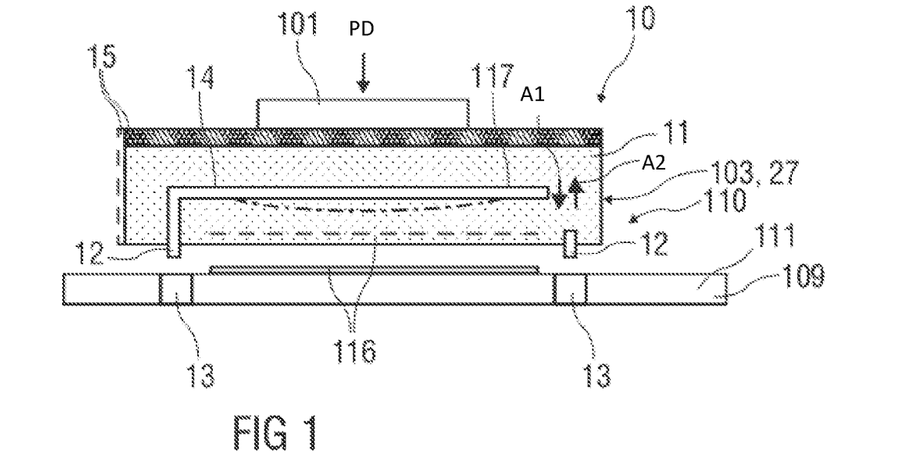
FIG. 1 is an exploded view of a first embodiment of an electronic sensor module.
Figure 2:
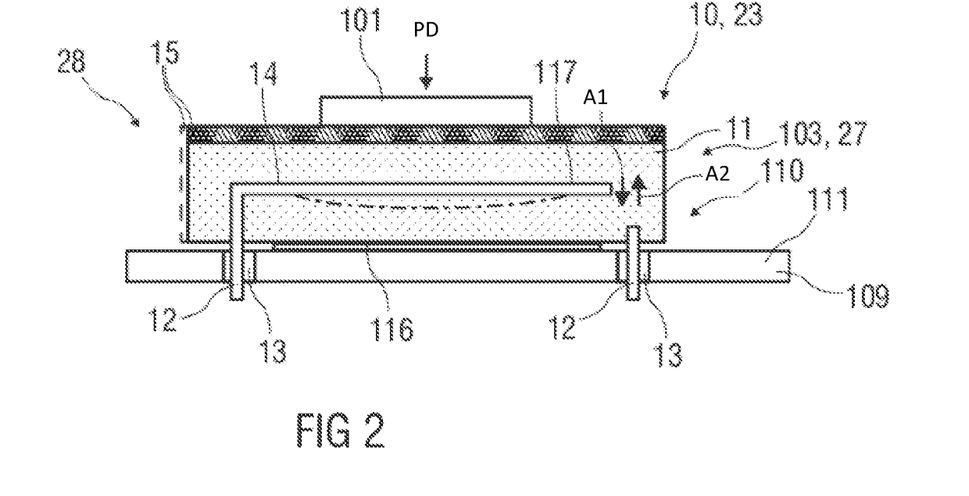
FIG. 2 shows the first embodiment of the sensor module according to FIG. 1 in the assembled state.

FIG. 1 shows a schematic exploded view of a possible embodiment for an electronic sensor module 10. FIG. 2 shows the electronic sensor module 10 in an assembled version.

The electronic sensor module 10 comprises at least one electronics unit 109 and a sensor unit 110 having a fixed sensor element 116 and a movable sensor element 117.

The fixed sensor element 116 is spaced apart from and arranged opposite the movable sensor element 117. The electronics unit 109 is connected to the sensor elements 116, 117 for triggering a switching signal. The electronics unit 109 comprises, for example, a printed circuit board 111.

The fixed sensor element 116 is designed, for example, as a metal layer, in particular a copper layer, on the printed circuit board 111.

In addition, the movable sensor element 117 is encapsulated at least in some regions by means of a foam material 11 and is designed as an integrated component 103 in the form of a preassembly unit 27. The integrated component 103 can be mounted as a preassembly unit 27 on the printed circuit board 111. In a preassembly state, as shown in FIG. 1, connection elements 12 protrude from the foam material 11 and the preassembly unit 27. In the assembled state, shown in FIG. 2, the connection elements 12 are connected, in particular electrically and mechanically connected, to the electronics unit 109, and form the integrated structural unit 23 of the electronic sensor module 10.

As shown in FIG. 1 with the aid of the dashed representation of the fixed sensor element 116, the fixed sensor element 116 can optionally also be encapsulated by the foam material 11.

To connect the movable sensor element 117 to the electronics unit 109, the movable sensor element 117 comprises the connection elements 12, which protrude from the foam material 11 and are to be connected (FIG. 1, preassembly state) or are connected, for example soldered (FIG. 2, assembled state) to the electronics unit 109. In the assembled state of the preassembly unit 27 having the printed circuit board 111, these together form the integrated structural unit 23 of the sensor module 10. This integrated structural unit 23 can in turn be designed as a separate assembly unit 28.

FIGS. 1 and 2 show plug contacts as connection elements 12. For this purpose, the connection elements 12 are designed as vertical electrical plug connections which are inserted through the through openings 13 of the printed circuit board 111 and which are then connected, in particular soldered, to the printed circuit board 111 on the opposite side via a conductor track or a connection contact.

The movable sensor element 117, for example a spring element such as a leaf spring or a metal sheet, is encapsulated in some regions by means of the foam material 11 in such a way that it is protected from external environmental influences such as moisture, rain, and dirty water. At least the movable sensor element 117 is surrounded by the foam material 11 and together with it forms the integrated component 103. The connection elements 12 thus also protrude from the integrated component 103.

In addition, such a resilient material is provided as the foam material 11 that the movable sensor element 117 is additionally resiliently mounted.

In this case, the foam material 11 can simultaneously execute a connecting, resetting, and sealing function. For the connecting function, the movable sensor element 117 can optionally be connected to the electronics unit 109, in particular the printed circuit board 111, by means of the foam material 11. In addition, the foam material 11 for a resetting function can be designed in such a way and encapsulate the movable sensor element 117 in such a way that it is automatically reset to a starting position or rest position after the end of a triggering movement, as shown by the arrows A1, A2.

By means of the foam material 11, the movable sensor element 117 is movably mounted in the sensor module 10, the foam material 11 assuming a connecting, resetting, and sealing function. Optionally, the fixed sensor element 116 of the sensor unit 110 can also be encapsulated by the foam material 11. In this embodiment, the fixed sensor element 116 is part of the preassembly unit 27.

In a further development, the movable sensor element 117 is designed as a resilient trigger element. As a result, the sensor unit 110 can be designed as a manually force-controlled pressure switch with a resetting function. For example, the sensor unit 110 is designed as a force sensor, in particular a force-controlled capacitive or inductive sensor, for performing a switching function.

For this purpose, an actuation element 101 is additionally provided, which is arranged, for example, above the movable sensor element 117, a resilient trigger element.

FIGS. 1 and 2 show the actuation element 101 as a plunger or push button which is arranged above the foam material 11. The actuation element 101 can in particular be actuated in the pressure direction PD.

In addition, the movable sensor element 117 can be switched as an electronic sensor element, in particular a capacitive sensor electrode, by means of the electronics unit 109. As a result, the sensor unit 110 can be used not only as a pressure switch but also to detect an approach of an object and thus serve as an approach sensor.

The movable sensor element 117 comprises a base element 14 which is encapsulated completely or in some regions by the foam material 11. The movable sensor element 117 is provided with the foam material 11 at least in the direction of the fixed sensor element 116. In other words: The foam material 11 is arranged at least between the movable sensor element 117 and the fixed sensor element 116.

The base element 14 is designed in particular as a trigger plate, in particular a spring sheet or a sheet metal plate. In the embodiment according to FIGS. 1 and 2, the connection elements 12 are designed as plug-in contacts and protrude vertically downward from the foam material 11.

In addition, the sensor unit 110 can be surrounded at least in some regions by a potting material 15. In particular, an outer layer around the foam material 11 can optionally be provided with the potting material 15.

In addition, the sensor module 10, in particular its electronic components preassembled with one another, such as the sensor unit 110 and the electronics unit 109, can be surrounded at least in some regions by the potting material 15. Such a sensor module 10 is designed as an integrated structural unit 23, in particular a separate assembly unit 28 or a separate assembly module.

The encapsulated and integrated component 103 with the movable sensor element 117, the optional fixed sensor element 116, and the optional actuation element 101 can form the preassembly unit 27, as shown in FIG. 1 in an exploded view. The preassembly unit 27 can then be mounted (encapsulated) on one side of the electronics unit 109 in this preassembly state and, in the assembled state, forms the separate assembly unit 28 of the electronic sensor module 10 as an integrated structural unit 23. The preassembly unit 27 as an encapsulated, integrated component 103 comprises the sensor system and optionally the actuation element 101. The associated electronics unit 109 is part of the integrated structural unit 23 and thus of the separate assembly unit 28.

Figure 3:
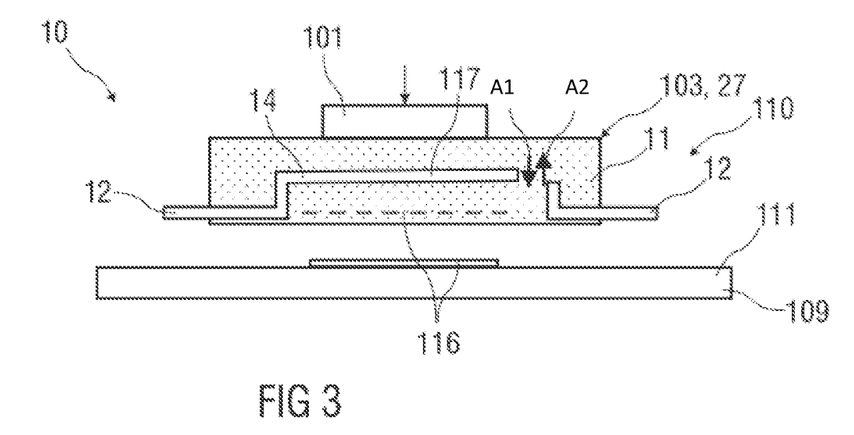
FIG. 3 is an exploded view of a second embodiment of a sensor module.
Figure 4:
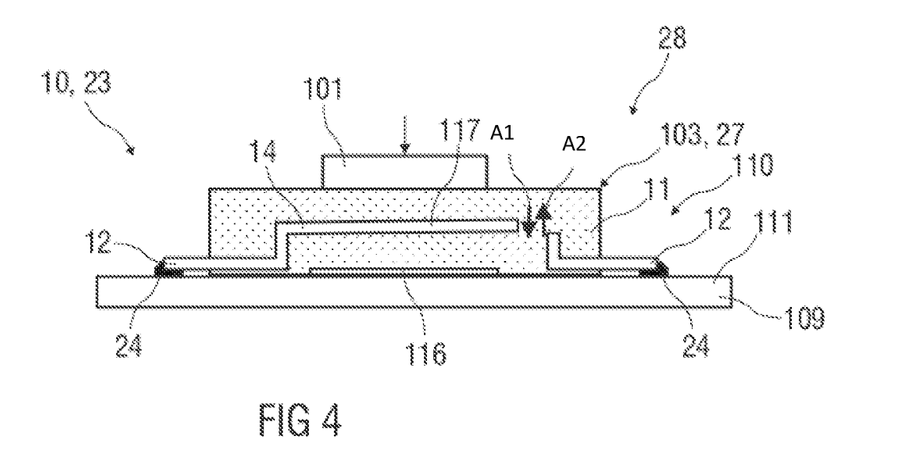
FIG. 4 shows the second embodiment of the sensor module according to FIG. 3 in the assembled state.

FIGS. 3 and 4 show a further optional embodiment of the electronic sensor module 10. Instead of plug contacts, the connection elements 12 are designed as surface connection elements (=so-called SMD connections) of the integrated component 103, in particular the preassembly unit 27, and protrude horizontally from the foam material 11, so that these connection elements 12 can be connected (FIG. 3, preassembly state) or are connected (FIG. 4, assembled state) to the electronics unit 109, in particular to a conductor track on the upper surface side of the printed circuit board 111. For example, the connection elements 12 are soldered directly onto the printed circuit board 111 as solderable connection surfaces 24.

Figure 5:
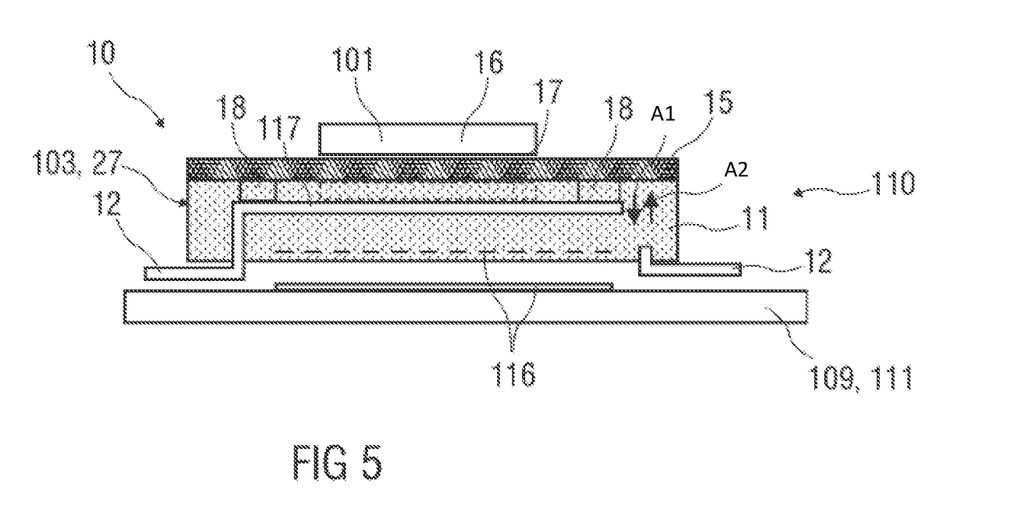
FIG. 5 is an exploded view of a third embodiment of a sensor module.

FIG. 5 shows a further optional embodiment of the electronic sensor module 10 having an at least partially encapsulated actuation element 101. In the embodiment according to FIG. 5, the actuation element 101 is designed in two parts and comprises an actuation plunger 16 and a counter plunger 17 arranged in the foam material 11. The actuation element 101 can be part of the integrated component 103 and thus of the preassembly unit 27. In addition, spacer elements 18 can be provided in order to limit the actuation movement, in particular a stroke movement, of the actuation element 101. These spacer elements 18 can also be provided for the electronic sensor module 10 in the other embodiments shown. The spacer elements 18 can be designed as a circumferential strand of material and, in addition to the support function and stop function, realize a sealing function.

Figure 6:
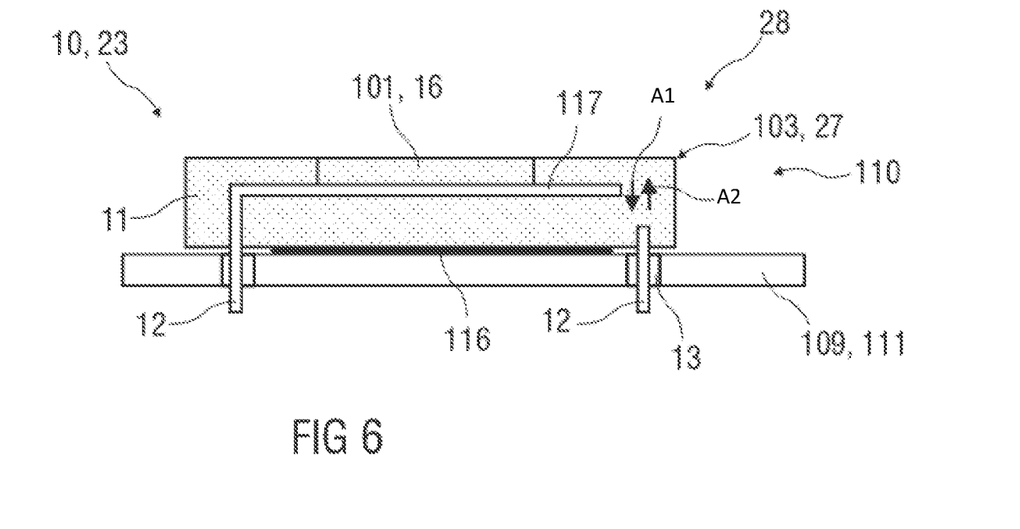
FIG. 6 shows a fourth embodiment of a sensor module in the assembled state.

FIG. 6 shows a further optional embodiment of the electronic sensor module 10 in the assembled state as a separate assembly unit 28, the actuation element 10 as an actuation plunger 16 being completely encapsulated by the foam material 11 and thus being part of the integrated component 103 and the preassembly unit 27.

In a further embodiment (not shown in detail), a multi-part actuation element 101 can comprise a counter plunger 17 which is designed below the movable sensor element 117 as part of the integrated component 103, and an actuation plunger 16 which is arranged above the movable sensor element 117.

Figure 7:
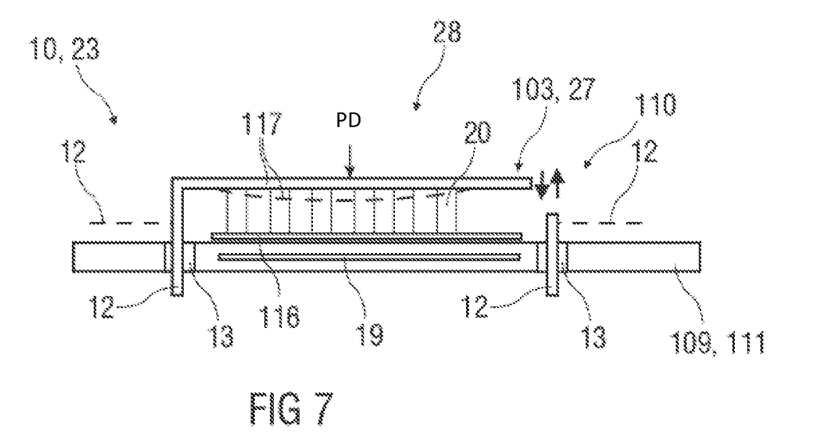
FIG. 7 shows a fifth embodiment of a sensor module in the assembled state.

FIG. 7 shows the design of the sensor unit 110 as a capacitive sensor, the movable sensor element 117 and the fixed sensor element 116 each forming electrodes which are spaced apart from one another, so that a measuring field 20 is formed between them when the sensor unit 110 is activated, so that, when the movable sensor element 117 is pressed in the pressure direction PD, the change in the capacitive measuring field is detected and used to determine the actuation stroke in order to trigger a switching function with a sufficiently large actuation stroke.

In addition, a shield 19, in particular as a metal layer in the printed circuit board 111, can be provided on the side of the fixed sensor element 116 facing away from the movable sensor element 117. For a better overview, the foam material 11 and the actuation element 101 have not been shown.

Figure 8:
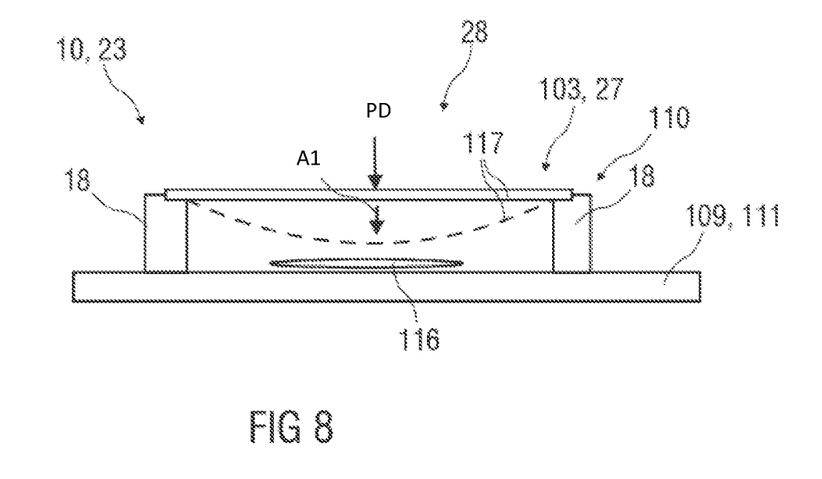
FIG. 8 shows a sixth embodiment of a sensor module in the assembled state.

FIG. 8 shows the design of the sensor unit 110 as an inductive sensor, the movable sensor element 117 being designed as a metal spring or sheet metal, and the fixed sensor element 116 being designed as a coil, which are spaced apart from one another, so that, when the movable sensor element 17 is pressed in the pressure direction PD, the change in the inductance of the coil is detected and used to determine the actuation stroke/force in order to trigger a switching function in the event of a sufficiently large change in inductance.

Figure 9:
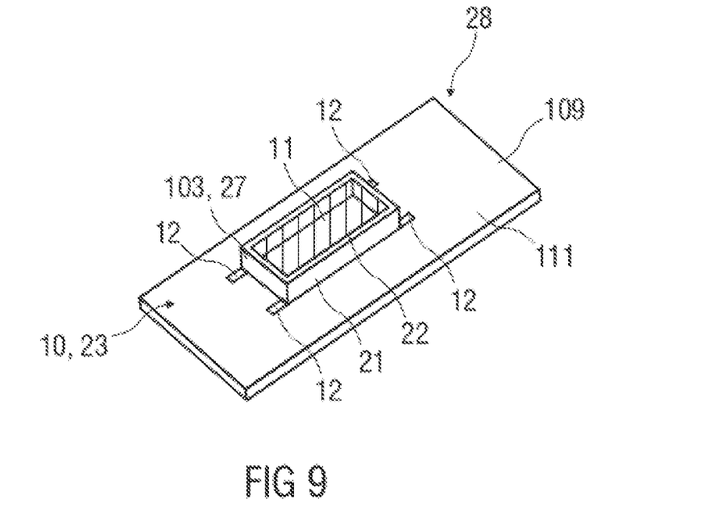
FIG. 9 is a perspective view of a sensor module as an assembly unit, FIG. 10 schematically shows a sectional view of a handle module with an electronic sensor module.

FIG. 9 shows the electronic sensor module 10 in a perspective view having the electronics unit 109 as a printed circuit board 111 in the assembled state as a separate assembly unit 28 and the integrated component 103 as a preassembly unit 27 which comprises at least the foam material 11 and the movable sensor elements 117 encapsulated therein (not shown). The foam material 11 can additionally be surrounded by a sensor housing 21. The sensor housing 21 can also be provided with a sealing strand 22 for additional sealing of the integrated component 103.

The electronic sensor module 10 can be preassembled with all components, the electronics unit 109, and the sensor unit 110 to form the integrated structural unit 23 as a separate assembly unit 28, which can be finally assembled as a whole in a handle module 100, which is described below by way of example.

Figure 10:
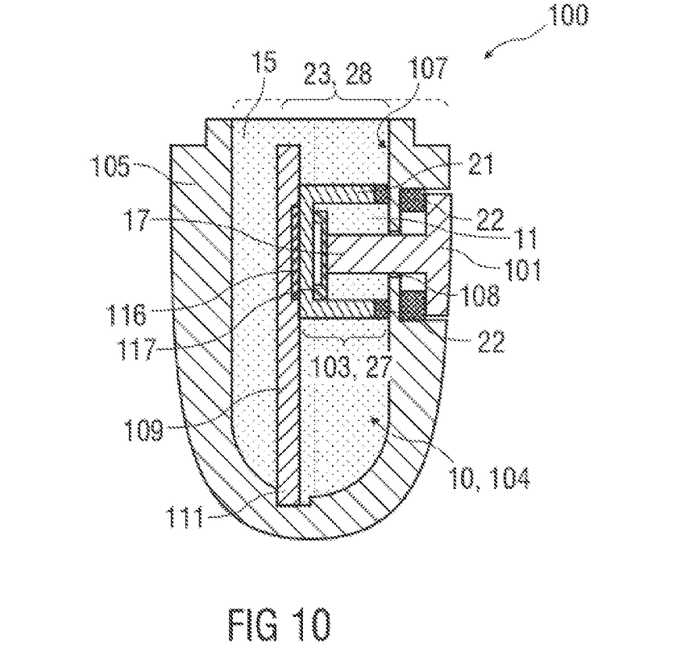

FIG. 10 shows a possible embodiment for a handle module 100 having an electronic sensor module 10, which can be arranged as an integrated structural unit 23 and assembly unit 28 in the handle module 100, in particular can be finally assembled and, after assembly, is arranged in a form-fitting and/or force-fitting manner.

The handle module 100 is an outside handle module for a movable vehicle element 201, in particular a vehicle door 202 of a vehicle 200, as shown in detail in the following FIG. 11 to 17.

The handle module 100 comprises, for example, at least the electronic sensor module 10 as an integrated structural unit 23 and a handle support 105, on or in which the sensor module 10 can be arranged or is held in a form-fitting and/or force-fitting manner in the assembled state.

The electronic sensor module 10 in the form of the integrated structural unit 23 can be preassembled as a whole to form the integrated structural unit 23 and then installed as a separate assembly unit 28 in the handle module 100, in particular finally assembled. The integrated structural unit 23 can comprise both the electronic sensor module 10 and the actuation element 101, which are mounted to the preassembly unit 27. Alternatively, the integrated structural unit 23 can only comprise the electronic sensor module 10 which is mounted separately as an assembly module in the handle support 105. The actuation element 101 is also mounted in the handle support 105 as a separate assembly element.

By designing the handle module 100 having the sensor module 10 located on the inside with encapsulated electronic components, these are arranged in a protected manner. In addition, the sensor module 10 can be encapsulated within the handle module 100 by means of a potting material 15.

In one possible embodiment, the electronic sensor module 10 is designed as a triggering unit 104 for automatically triggering a function, in particular for triggering an unlocking and automatic opening of the door lock of the vehicle door 202. By integrating the electronics unit 109 and sensor unit 110 into the electronic sensor module 10 and thus into the triggering unit 104, the sensor module 10 can, in addition to the triggering function, assume and execute other functions, for example other electronic handle, lock, and/or door functions.

The actuation element 101 is arranged above the movable sensor element 117 in the handle support 105 and comprises the actuation plunger 17 which protrudes through the through opening 108 in the handle support 105 and actuates the movable sensor element 117 and consequently generates an actuation signal by means of the electronics unit 109 in order to trigger a switching function for the door lock.

By designing the sensor module 10 as an integrated structural unit 23 in the handle module 100 and the additional encapsulation of the sensor module 10 by the handle support 105 and the actuation element 101 and the sealing strands 22, an additional sealing plane on the outer side of the handle module 100 is provided, so that the actuation mechanism, in particular a lifting mechanism, of the actuation element 101 is also sealed.

The integrated component 23 of the sensor module 10 is arranged and mounted in the handle support 105 on an inner side 107 of the handle support 105 in the region of the through opening 108 and opposite the actuation element 101. This allows a compact design of the handle module and small actuation strokes.

Figure 11:
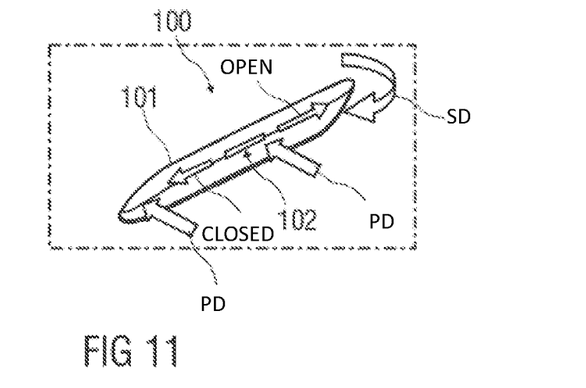
FIG. 11 is a schematic top view of a handle module.

FIG. 11 shows a schematic plan view of a handle module 100 having an actuation element 101 with an outer actuation surface 102. The actuation element 101 can in particular be actuated in the pressure direction PD.

Additionally or optionally, the actuation element 101 can be actuated in the swivel direction SD.

Optionally, the handle module 100 can be designed to recognize a gesture control for a closing direction CLOSED and an opening direction OPEN.

Figure 12:
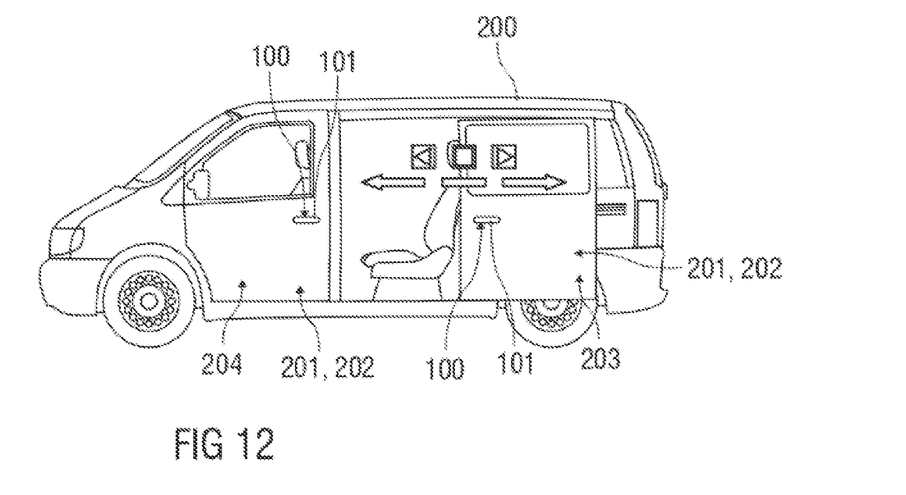
FIG. 12 is a schematic side view of a vehicle having a movable vehicle element which comprises a handle module for unlocking a door lock, FIG. 13 schematically shows a perspective partial view of the handle module having a sensor module as an integrated structural unit.

FIG. 12 is a schematic side view of a vehicle 200 having two movable vehicle elements 201. The movable vehicle element 201 is, for example, a vehicle door 202, in particular a sliding door 203 or a pivot door 204. The vehicle element 201 comprises the handle module 100 for unlocking a door lock and for opening the vehicle element 201.

Figure 13:
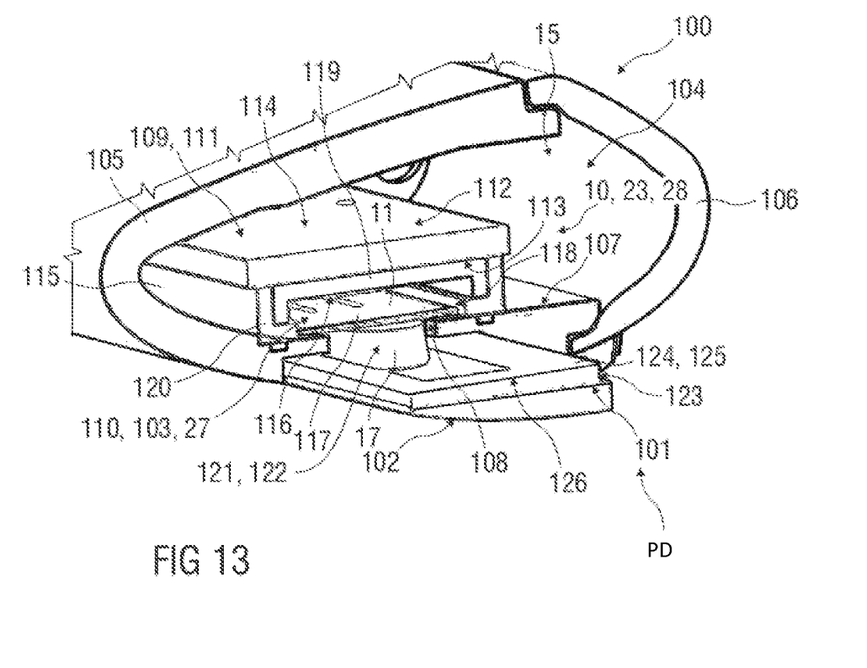
Figure 14:
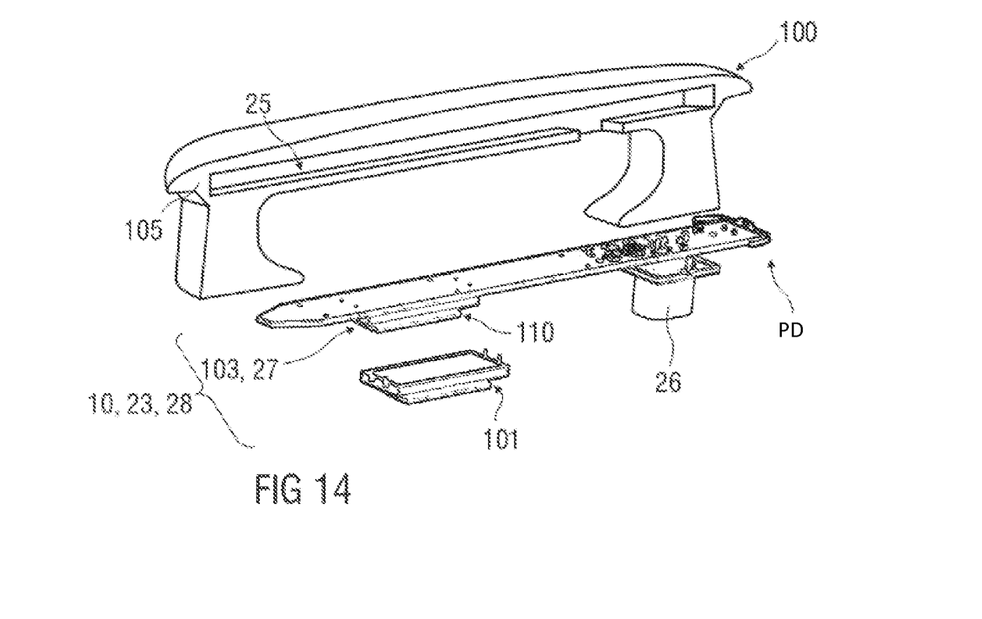
FIG. 14 is a schematic exploded view of the handle module having a sensor module as an integrated structural unit, FIG. 15 schematically shows an upper side of the integrated structural unit for the handle module, FIG. 16 schematically shows an underside of the integrated structural unit for the handle module, and FIG. 17 schematically shows, in a block diagram, components of an electronics unit of the sensor module.

FIGS. 13 and 14 schematically show a perspective partial view or an exploded view of the handle module 100 with the electronic sensor module 10 as an integrated structural unit 23 and triggering unit 104 and with the integrated module 103 which comprises at least the encapsulated movable sensor element 117.

The handle module 100 is designed as an outside door handle module and comprises the actuation element 101 having the outer actuation surface 102. The handle module 100 also comprises the handle support 105 on which the actuation element 101 is held. The triggering unit 104 is provided for the automatic unlocking and for the automatic opening of a door lock of the associated vehicle door 202. The triggering unit 104 is designed as an integrated component 103 and is arranged in a preassembled manner in the handle support 105.

In addition, the handle module 100 comprises a handle cover 106, for example a chrome or plastics cover.

The triggering unit 104 as an integrated component 103 can be installed as a whole in the handle module 100. Due to the design of the triggering unit 104 as an integrated module, there is no need for complex individual assembly steps.

FIG. 14 shows an exploded view of the handle module 100, which is designed as a handle element, and of the sensor module 10.

The handle support 105 and the cover 106 at least partially surround the sensor module 10 which as a whole can be built into and mounted as an integrated structural unit 23 in the handle module 100. For this purpose, the handle module 100 comprises, for example, a recess 25 in the handle support 105, into which the sensor module 10 can be inserted or pushed as a preassembled integrated structural unit 23 and is held there in a form-fitting and/or force-fitting manner. For example, the sensor unit 110, the electronics unit 109, the actuation element 101, and/or optionally a microswitch 26 are preassembled on the electronics unit 109, and, in the assembled state, form the integrated structural unit 23 which is then inserted into the recess 25, in particular a slot or an opening, and is held in the recess 25, for example, in a form-fitting and/or force-fitting manner, for example by means of frictional engagement or latching.

The handle cover 106 is, for example, a chrome or plastics cover.

In addition, by designing the handle module 100 with the outer actuation element 101, an electric door lock can be safely triggered by pressing it, the electronic components of the triggering unit 104 which are located on the inside being arranged in a protected manner. For this purpose, the triggering unit 104 is protected, for example, by encapsulation, in particular additionally by means of a potting material 15.

For example, the handle support 105 and the actuation element 101 surround the triggering unit 104 in an encapsulating manner. By designing the triggering unit 104 as an integrated module 104 and the additional encapsulation of this by the handle support 105 and the actuation element 101, an additional sealing plane is provided on the outer side of the handle module 100, so that the actuation mechanism, in particular a lifting mechanism, of the actuation element 101 is also sealed.

The integrated component 103 is arranged and mounted in the handle support 105 on the inner side 107 of the handle support 105 in the region of the through opening 108 and opposite the actuation element 101. This allows for a compact design of the handle module 100 and small actuation strokes.

In detail, the triggering unit 104 comprises, for example, an electronics unit 109 and a sensor unit 110, which are preassembled to form the integrated component 103.

By integrating the electronics unit 109 and the sensor unit 110 into the triggering unit 104 of the sensor module 10, the latter can assume and execute further functions, for example further electronic handle, lock, and/or door functions.

The electronics unit 109 comprises the printed circuit board 111 having a first surface side 112 and a second surface side 113. An integrated circuit arrangement 114, for example multi-function electronics for one or more functions, in particular for one or more electronic handle, lock, and/or door functions, is arranged on the first surface side 112. The sensor unit 110 is arranged on the opposite, second surface side 113.

The sensor unit 110 is designed, for example, as a force sensor, in particular a force-controlled capacitive sensor, for unlocking and opening the door lock and the vehicle door 202.

In particular, the sensor unit 110 is designed as a so-called MOC module (=metal-over-cap module), in which the metallic sensor components located on the inside are encapsulated from the outside.

The sensor unit 110 also comprises the sensor housing 115, the fixed sensor element 116, and the movable sensor element 117.

The fixed sensor element 116 is arranged directly on the second surface side 113 of the printed circuit board 111. The movable sensor element 117 is arranged at a distance from the fixed sensor element 116 in a receiving opening 118 of the sensor housing 115. The sensor housing 115 and the movable sensor element 117 encapsulate, from the outside, the fixed sensor element 116 located on the inside. The sensor housing 115 is in particular a plastics housing and can be molded, in particular injection molded, onto the printed circuit board 111. The sensor housing 115 can be designed as a 2-component housing. For example, the sensor housing 115 can have a soft housing wall 119 located on the inside and an outer hard housing wall 120 surrounding it.

When the integrated component 103 is in the built-in state in the handle module 100, the movable sensor element 117 is arranged in the region of the through opening 108 in such a way that it at least partially covers the through opening 108 from the inside.

The actuation element 101 is arranged in the region of the through opening 108 in such a way that it at least partially covers the through opening 108 from the outside. In particular, the actuation element 101 protrudes into the through opening 108 at least in some regions in such a way that, in an unactuated position, as shown in FIG. 13, it is arranged spaced apart from the movable sensor element 117.

This allows for a compact design of the handle module 100 and small actuation strokes. In addition, the actuation forces can be set; in particular, threshold values can be specified. For example, threshold values for the actuation stroke can be specified so that unlocking of the door lock is only triggered when the actuation stroke has exceeded the specified threshold value. If, however, a threshold value for the actuation stroke is not reached, the door lock is not unlocked. The threshold values for the actuation stroke can also vary as a function of the recorded values of further parameters, such as, for example, air humidity, temperature, speed of the vehicle, etc., and can thus be dynamically adapted accordingly. For this purpose, the electronics unit 109 comprises appropriate filters, software logics, and/or analysis modules. In addition, the encapsulation by means of the foam material 11 and the sealing by means of the sealing strands 22 allow tolerance compensations, in particular the compensation of manufacturing tolerances for calibrating the sensor unit 110.

In addition, the actuation element 101 can comprise a pressure transmission element 121 that protrudes inward from the outer actuation surface 102 in the direction of the sensor unit 110. For example, the actuation element 101 comprises an actuation plunger 16, for example an inwardly protruding pressure pin 122, which, when the actuation element 101 is actuated, can be moved in the pressure direction PD and thus in the direction of the movable sensor element 117.

The actuation element 101 can be actuated by pressure in such a way that it can be moved in the pressure direction PD through the through opening 108 up to the movable sensor element 117 and moves the latter in the direction of the fixed sensor element 116 upon further pressure actuation. As a result, the distance between the movable sensor element 117 and the fixed sensor element 116 is reduced, so that the measuring field 20 present between them changes.

To detect this change in the measuring field, the sensor unit 110 is designed as a capacitive pressure sensor, the fixed sensor element 116 and the movable sensor element 117 being designed as electrodes which are signal-coupled to an electronic switching unit of the electronics unit 109 on the rear side (=first surface side 112) of the printed circuit board 111. If the electronic switching unit detects a change in the measuring field due to the actuation of the pressure, the door lock is opened automatically.

For this purpose, the movable sensor element 117 is designed, for example, as a leaf spring, a spring plate, or a spring sheet.

Furthermore, the actuation element 101 has an inner side 123 opposite the outer actuation surface 102, which inner side is sealingly connected to the handle support 105 by means of a connecting element 124, at least in the region of the through opening 108. In other words: The actuation element 101 is connected, in particular glued, to the handle support 105 by means of the connecting element 124.

The connecting element 124 can additionally be designed as a resetting element 125 which, when the actuation element 101 is actuated from an unactuated position to an actuated position, resets it to the unactuated position when the actuation element is not actuated.

For this purpose, the connecting element 124 is designed, for example, as a plastics strand, in particular a rubber or foam strand. In particular, the connecting element 124 is formed from a soft component material, in particular from a foam, plastics or rubber material. For example, the connecting element 124 is formed from a PUR foam, in particular a CeraPur foam.

On the inner side 123 of the actuation element 101 facing the sensor unit 110, the connecting element 124 can moreover form a circumferential sealing strand 126 arranged in the edge region of the through opening 108.

Alternatively or additionally, the connecting element 124 can surround the actuation element 101 on the inner side 123 facing the sensor unit 110 and seal it against moisture and contamination.

The connecting element 124 thus takes on a plurality of functions: at least sealing, fastening, and restoring. In addition, the connecting element 124 can serve to dampen vibrations.

Figure 15:
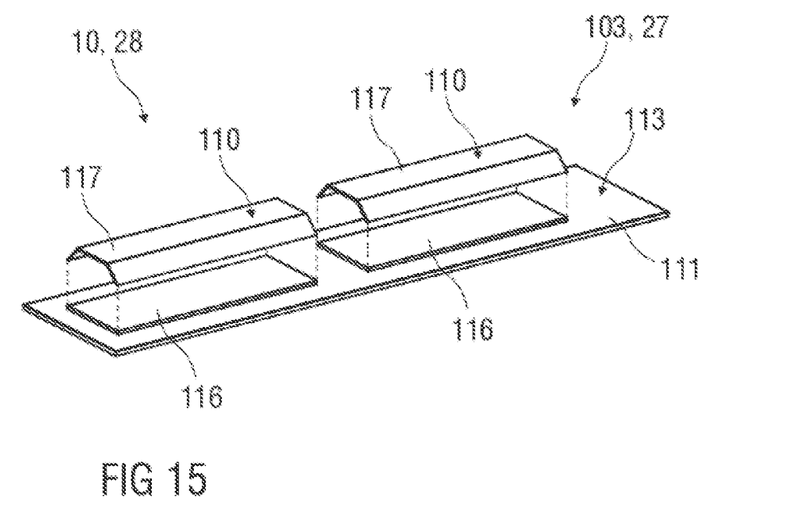
Figure 16:
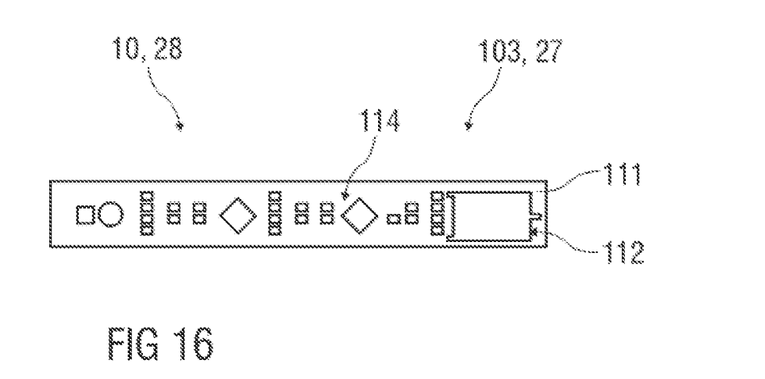

FIGS. 15 and 16 schematically show an upper and lower side of the integrated component 103 for the handle module 100. The integrated component 103 comprises the printed circuit board 111 having the first surface side 112 and the second surface side 113. The integrated circuit arrangement 114, for example multi-function electronics for one or more functions, in particular for one or more electronic handle, lock, and/or door functions, is arranged on the first surface side 112. On the opposite, second surface side 113, the sensor unit 110, in particular its fixed sensor element 116 and the movable sensor element 117 spaced apart therefrom, is arranged and preassembled.

Figure 17:
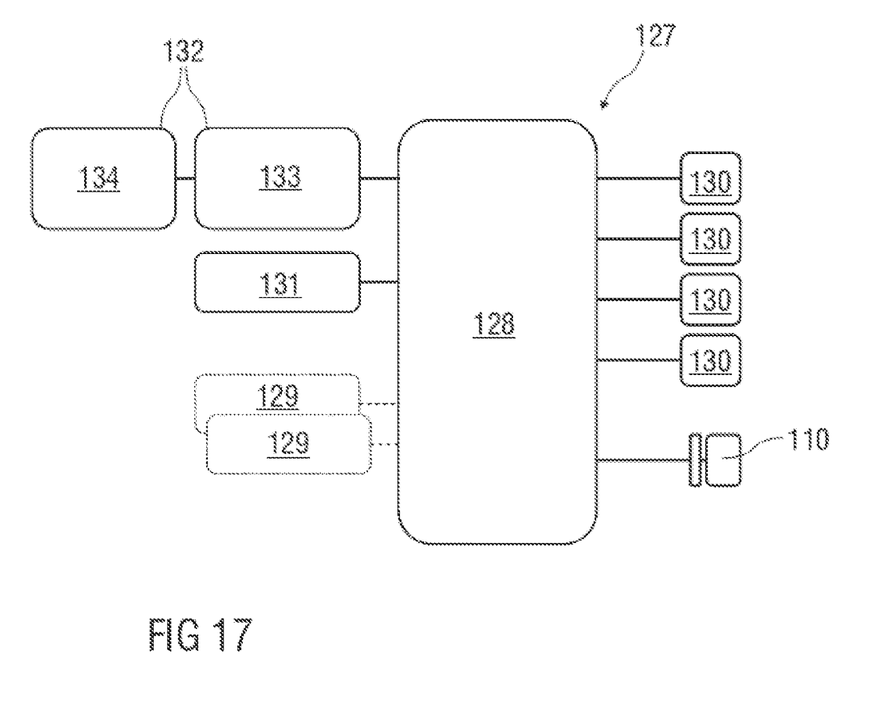

FIG. 17 schematically shows, in a block diagram, components of the integrated component 103, in particular the components of an electronic circuit 127 for the sensor unit 110. The electronic circuit 127 is part of the integrated circuit arrangement 114 of the printed circuit board 111 and comprises, for example, a microcontroller 128. The microcontroller 128 comprises software logic, by means of which the measuring field change detected by the sensor unit 110 is analyzed and the door lock is accordingly unlocked and thus opened.

Furthermore, the software logic of the microcontroller 128 can be designed so that when the unlocked vehicle door 202 is moved, the movement of the vehicle door 202 can be stopped at any position if a change in the measuring field is identified due to a renewed pressing of the actuation element 101.

Thus, the triggering unit 104 coupled to the integrated circuit arrangement 114 allows both unlocking and thus opening the door lock by pressing the actuation element 101 and stopping the moving vehicle door 202 at any desired position by pressing the actuation element 101 again.

The microcontroller 128 can comprise further software functions for the door lock, the vehicle door 202, and/or the handle module 100. For this purpose, the microcontroller 128 is coupled to other components, for example via one or more communication interfaces 129, for example a LIN interface or a CAN interface. Furthermore, further sensors 130 optionally implemented in the handle module 100, for example further capacitive sensors for gesture recognition and/or approach recognition, can be signal-coupled to the microcontroller 128.

Furthermore, the microcontroller 128 can be signal-coupled via further input and output interfaces 131 with other electronic components or external, mobile devices, such as a mobile phone.

In addition, the microcontroller 128 can be signal-coupled to further software modules 132, for example a voltage regulator 133 and/or an EMC protective device 134.

In addition, threshold value modules, filter modules, rain modules, disruption modules, time modules, speed modules can be implemented in the microcontroller 128 to identify an actuation of the actuation element 101, which, for example, dynamically adjusts threshold values to identify a change in the measuring field, depending on temperature, rain, EMC interference, operating speed, and/or air humidity, in order to determine a pressure actuation of the actuation element 101 safely and quickly.

For example, in the event of a strong signal swing in a fast trigger time, no relevant actuation and thus no trigger signal for unlocking the door lock is generated.

With a slow operating speed, a trigger signal for unlocking is generated when the signal level exceeds the specified threshold value.

For example, a value of 2 mm is specified as the threshold value for an actuation stroke.

LIST OF REFERENCE SIGNS

10 Sensor module
11 Foam material
12 Connection element
13 Through opening
14 Base element
15 Potting material
16 Actuation plunger
17 Counter plunger
18 Spacer element
19 Shielding
20 Measuring field
21 Sensor housing
22 Sealing strand
23 Integrated structural unit
24 Connection surface
25 Recess
26 Microswitch
27 Preassembly unit
28 Assembly unit
100 Handle module
101 Actuation element
102 Actuation surface
103 Integrated component
104 Triggering unit
105 Handle support
106 Cover
107 Inner side
108 Through opening
109 Electronics unit
110 Sensor unit
111 Printed circuit board
112 First surface side
113 Second surface side
114 Integrated circuit arrangement
115 Sensor housing
116 Fixed sensor element
117 Movable sensor element 118 Receiving opening
119 Soft housing wall
120 Hard housing wall
121 Force transmission element
122 Pressure pin
123 Inner side
124 Connecting element
125 Resetting element
126 Sealing strand
127 Electronic switch
128 Microcontroller
129 Communication interface
130 Sensor
131 Input and output interface
132 Software module
133 Voltage regulator
134 EMC protective device
200 Vehicle
201 Movable vehicle element
202 Vehicle door
203 Sliding door
204 Pivot door
OPEN Opening direction
PD Pressure direction
A1, A2 Arrow
SD Swivel direction
CLOSED Closing direction

The invention claimed is:

1. An electronic sensor module for a handle, comprising:
one sensor unit, comprising:
a movable sensor element and
a fixed sensor element which is arranged spaced apart from and opposite the movable sensor element, and
one electronics unit that is electrically connected to the sensor elements for triggering a switching signal and on which the fixed sensor element is arranged,
wherein only the movable sensor element is encapsulated at least in some regions by a foam material and is designed as an integrated component in the form of a preassembly unit separable from the electronics unit,
wherein connection elements of the movable sensor element protrude from the foam material in a preassembly state and are connected to the electronics unit in an assembled state,
wherein the connection elements are electrically connected to the electronics unit and extend from a first side of the electronics unit, upon which the fixed sensor element is attached, to a second opposite side of the electronics unit,
wherein the movable sensor element comprises a base element which is encapsulated completely by the foam material.

2. The electronic sensor module according to claim 1, wherein, in the assembled state of the preassembly unit having the electronics unit, the electronic sensor module is designed as an integrated structural unit and a separate assembly unit.

3. The electronic sensor module according to claim 1, wherein the sensor unit is additionally surrounded at least in some regions by a potting material.

4. The electronic sensor module according to claim 1, wherein the sensor unit is designed as a force sensor for executing a switching function.

5. The electronic sensor module according to claim 1, wherein an actuation element is provided for actuating the movable sensor element and is arranged above and/or below the movable sensor element.

6. The electronic sensor module according to claim 5, wherein the actuation element is encapsulated in some regions or completely by the foam material and is part of the integrated component and the preassembly unit.

7. An outside handle module for a movable vehicle element of a vehicle, wherein the handle module comprises the electronic sensor module according to claim 1 and a handle support on or in which the electronic sensor module can be arranged.

8. The outside handle module according to claim 7, wherein the electronic sensor module is designed as a triggering unit for automatically triggering a function, said triggering function comprising triggering an unlocking and automatic opening of a door lock of the door.

9. The outside handle module according to claim 8 wherein, when an actuation element is arranged above a movable sensor element, the handle support and the actuation element surround the triggering unit in an encapsulating manner.

10. The outside handle module according to claim 9, wherein the integrated component is arranged and mounted in the handle support on an inner side of the handle support in the region of a through opening and opposite the actuation element.

11. The outside handle module according to claim 10, wherein the electronics unit comprises a printed circuit board having a first surface side and a second surface side, wherein an integrated circuit arrangement is arranged on the first surface side, and the sensor unit is arranged on the opposite second surface side.

12. The outside handle module according to claim 11, wherein the sensor unit additionally comprises a sensor housing, wherein the fixed sensor element is arranged directly on the second surface side of the printed circuit board, and the movable sensor element is arranged at a distance from the fixed sensor element in a receiving opening of the sensor housing.

13. A movable vehicle element having the outside handle module according to any claim 7, wherein the sensor module can be arranged or is arranged in or on the outside handle module.

14. An electronic sensor module for a handle, comprising:
one sensor unit, comprising:
a movable sensor element and
a fixed sensor element which is arranged spaced apart from and opposite the movable sensor element, and
one electronics unit that is electrically connected to the sensor elements for triggering a switching signal and on which the fixed sensor element is arranged,
wherein the movable sensor element is encapsulated at least in some regions by a foam material and is designed as an integrated component in the form of a preassembly unit,
wherein connection elements of the movable sensor element protrude from the foam material in a preassembly state and are connected to the electronics unit in an assembled state,
wherein the connection elements are directly electrically connected to the movable sensor element and extend through the foam to a first side of the electronics unit where they are attached with solder, wherein the fixed sensor element is attached to the first side of the electronics unit,
wherein the movable sensor element comprises a base element, wherein upper and lower surfaces of the base element are in direct facing contact with the foam material.

* * * * *